(12) United States Patent
Yamazaki et al.

(10) Patent No.: US 12,413,206 B2
(45) Date of Patent: Sep. 9, 2025

(54) ACOUSTIC WAVE DEVICE

(71) Applicant: Murata Manufacturing Co., Ltd., Nagaokakyo (JP)

(72) Inventors: Hisashi Yamazaki, Nagaokakyo (JP); Seiji Kai, Nagaokakyo (JP); Takeshi Nakao, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 835 days.

(21) Appl. No.: 17/706,723

(22) Filed: Mar. 29, 2022

(65) Prior Publication Data

US 2022/0321097 A1  Oct. 6, 2022

Related U.S. Application Data

(60) Provisional application No. 63/168,296, filed on Mar. 31, 2021.

(51) Int. Cl.
  *H03H 9/54* (2006.01)
  *H03H 9/02* (2006.01)
  *H03H 9/13* (2006.01)

(52) U.S. Cl.
  CPC .......... *H03H 9/54* (2013.01); *H03H 9/02007* (2013.01); *H03H 9/02228* (2013.01); *H03H 9/13* (2013.01)

(58) Field of Classification Search
  CPC ........ H03H 9/54; H03H 9/13; H03H 9/02007; H03H 9/02228
  See application file for complete search history.

(56) References Cited

U.S. PATENT DOCUMENTS

2005/0140247 A1* 6/2005 Lee .................... H03H 9/02149
                                                             310/320
2020/0321937 A1* 10/2020 Kishi ....................... H03F 3/72

FOREIGN PATENT DOCUMENTS

JP   2012-257019 A   12/2012
WO   2019/124128 A1   6/2019

* cited by examiner

*Primary Examiner* — Bryan M Lettman
(74) *Attorney, Agent, or Firm* — Keating & Bennett, LLP

(57) ABSTRACT

An acoustic wave device includes a support including a support substrate, a piezoelectric layer on the support, a functional electrode at the piezoelectric layer, a frame-shaped support frame on the piezoelectric layer and surrounding the functional electrode in a plan view in a stacking direction of the support and the piezoelectric layer. A lid covering an opening of the support frame, wherein the support includes a first cavity at a position overlapping at least a portion of the functional electrode in the plan view, a second cavity defined by the piezoelectric layer, the support frame, and the lid between the piezoelectric layer and the lid. The piezoelectric layer includes a through hole communicating with the first and second cavities, and the first and second cavities are under vacuum.

20 Claims, 10 Drawing Sheets

ACOUSTIC WAVE DEVICE

CROSS REFERENCE TO RELATED APPLICATIONS

This application claims the benefit of priority to U.S. Patent Application No. 63/168,296 filed on Mar. 31, 2021. The entire contents of this application are hereby incorporated herein by reference.

BACKGROUND OF THE INVENTION

1. Field of the Invention

The present disclosure relates to an acoustic wave device including a piezoelectric layer.

2. Description of the Related Art

For example, International Publication No. 2019/124128 discloses an acoustic wave device including a silicon supporting substrate, a piezoelectric structure, an IDT electrode, a supporting layer, a cover layer, a through via electrode, and a wiring electrode. The silicon supporting substrate has first and second main surfaces that are on opposite sides from each other. The piezoelectric structure is provided on the first main surface of the silicon supporting substrate and has a piezoelectric layer. The IDT electrode is provided on the piezoelectric layer. The supporting layer is provided on the first main surface of the silicon supporting substrate so as to surround the piezoelectric layer. The cover layer is provided on the supporting layer. The through via electrode is provided so as to penetrate through the silicon supporting substrate and the piezoelectric structure. The wiring electrode is connected to the through via electrode, while being electrically connected to the IDT electrode.

In recent years, there has been a demand for an acoustic wave device capable of suppressing deterioration of characteristics due to heat from the outside and suppressing breakage of a piezoelectric layer.

SUMMARY OF THE INVENTION

Preferred embodiments of the present invention provide acoustic wave devices that are each able to reduce or prevent deterioration of characteristics due to heat from the outside and reduce or prevent breakage of a piezoelectric layer.

An acoustic wave device according to a preferred embodiment of the present invention includes a support including a support substrate, a piezoelectric layer on the support, a functional electrode at the piezoelectric layer, a frame-shaped support frame on the piezoelectric layer and surrounding the functional electrode in a plan view in a stacking direction of the support and the piezoelectric layer, and a lid covering an opening of the support frame, wherein the support includes a first cavity overlapping at least a portion of the functional electrode in the plan view in the stacking direction of the support and the piezoelectric layer, a second cavity defined by the piezoelectric layer, the support frame, and the lid between the piezoelectric layer and the lid, the piezoelectric layer includes a through hole communicating with the first cavity and the second cavity, and the first cavity and the second cavity are under vacuum.

According to preferred embodiments of the present invention, it is possible to provide acoustic wave devices that are each able to reduce or prevent deterioration of characteristics due to heat from the outside and reduce or prevent breakage of a piezoelectric layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Acoustic wave devices according to preferred embodiments of the present invention each include a piezoelectric layer including lithium niobate or lithium tantalate, and a first electrode and a second electrode opposing each other in a direction intersecting a thickness direction of the piezoelectric layer.

An acoustic wave device according to a preferred embodiment of the present invention uses a bulk wave of a thickness slip primary mode.

In an acoustic wave device according to a preferred embodiment of the present invention, the first electrode and the second electrode are adjacent to each other, and d/p is about 0.5 or less where the thickness of the piezoelectric layer is d and the center-to-center distance between the first electrode and the second electrode is p. This makes it possible to increase the Q factor even in a case where miniaturization is achieved.

An acoustic wave device according to a preferred embodiment of the present invention uses a Lamb wave as a plate wave, such that resonance characteristics due to the Lamb wave can be obtained.

An acoustic wave device according to a preferred embodiment of the present invention includes a piezoelectric layer including lithium niobate or lithium tantalate, and an upper electrode and a lower electrode opposing each other in a thickness direction of the piezoelectric layer with the piezoelectric layer interposed between the upper electrode and the lower electrode, and uses a bulk wave.

Hereinafter, the present invention will be clarified by describing acoustic wave devices according to preferred embodiments of the present invention with reference to the drawings.

The preferred embodiments described in the present description are exemplary, and partial replacement or combination of configurations is possible between different preferred embodiments.

First Preferred Embodiment

Figure 1A:
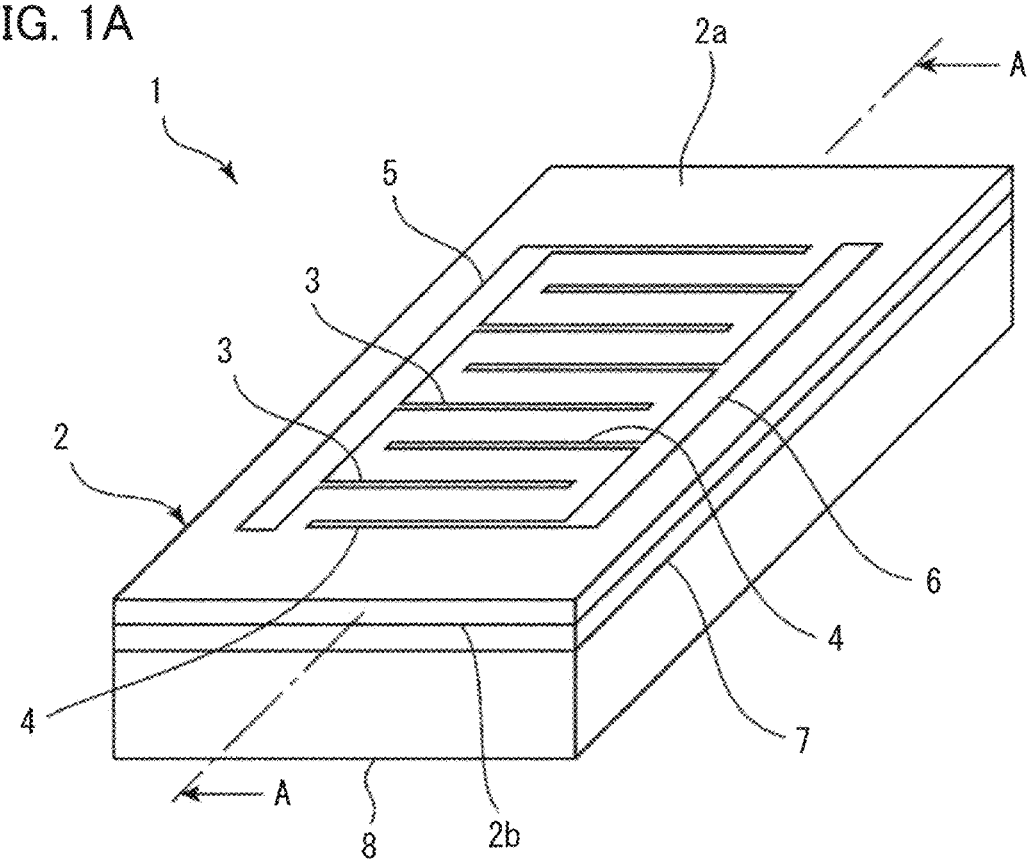
FIG. 1A is a schematic perspective view illustrating an acoustic wave device according to a preferred embodiment of the present invention.
Figure 1B:
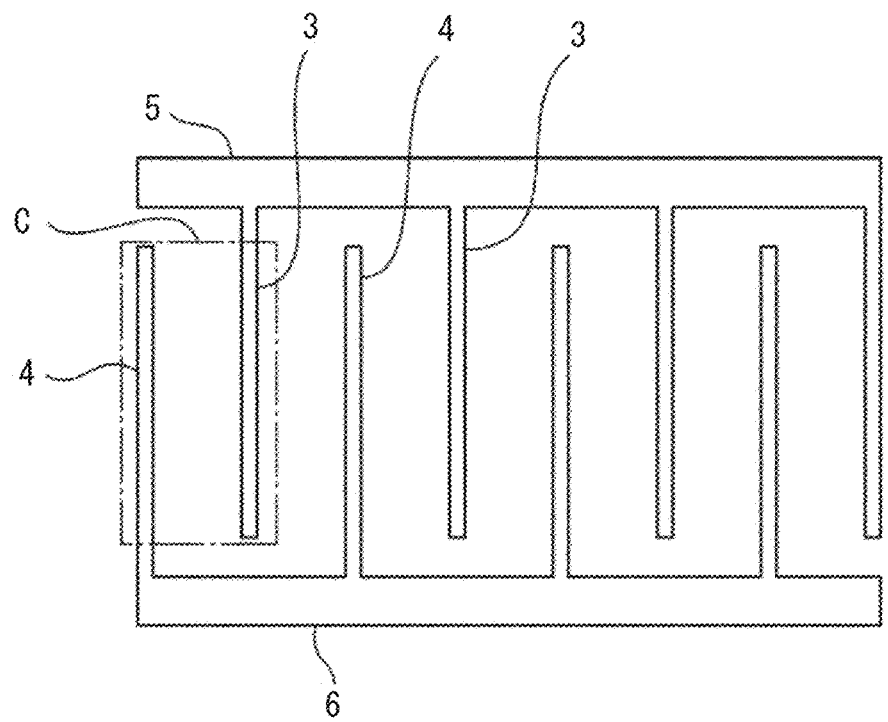
FIG. 1B is a plan view illustrating an electrode structure on a piezoelectric layer.
Figure 2:
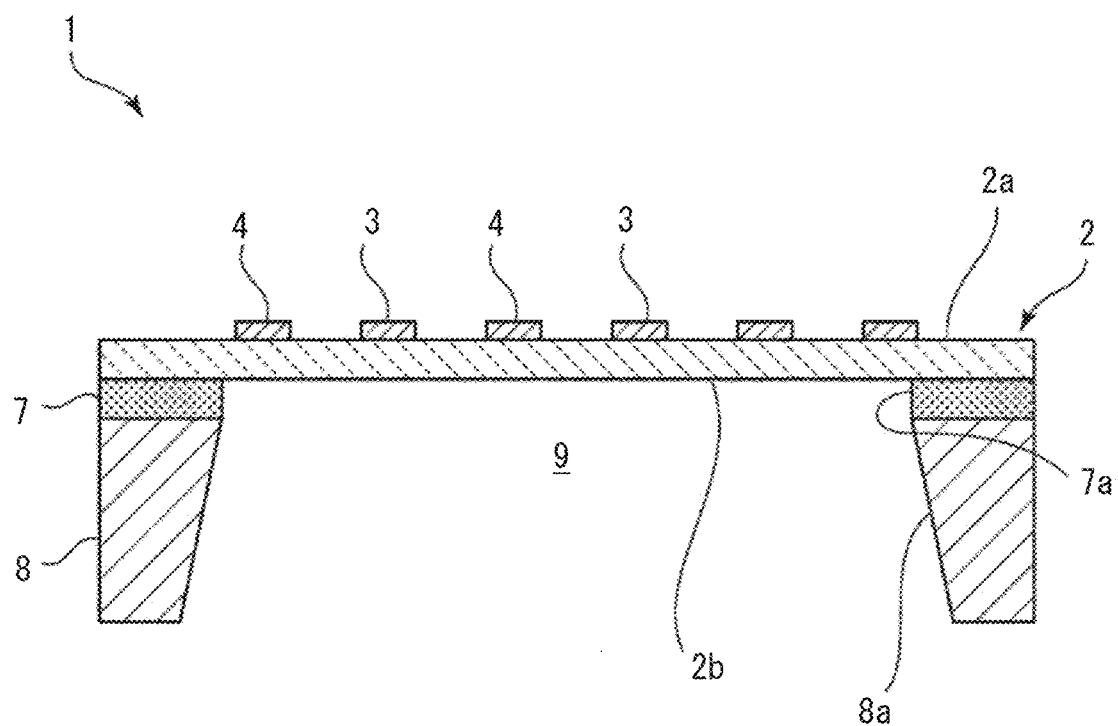
FIG. 2 is a cross-sectional view of a portion taken along line A-A in FIG. 1A.

FIG. 1A is a schematic perspective view illustrating an appearance of an acoustic wave device according to a first preferred embodiment of the present invention, FIG. 1B is a plan view illustrating the electrode structure on the piezoelectric layer, and FIG. 2 is a cross-sectional view of a portion taken along line A-A in FIG. 1A.

An acoustic wave device 1 includes a piezoelectric layer 2 made of, for example, $LiNbO_3$. The piezoelectric layer 2 may be made of, for example, $LiTaO_3$. In the present preferred embodiment, the cut angle of $LiNbO_3$ or $LiTaO_3$ is Z cut, but may be rotation Y cut or X cut. A propagation orientation of Y propagation and X propagation is preferably, for example, about ±30°. The thickness of the piezoelectric layer 2 is not particularly limited, but is preferably, for example, about 50 nm or more and about 1000 nm or less in order to effectively excite the thickness slip primary mode.

The piezoelectric layer 2 includes first and second main surfaces 2a and 2b opposing each other. An electrode 3 and an electrode 4 are provided on the first main surface 2a. Here, the electrode 3 is an example of the "first electrode", and the electrode 4 is an example of the "second electrode". In FIGS. 1A and 1B, the plurality of electrodes 3 are a plurality of first electrode fingers connected to a first bus bar 5. The plurality of electrodes 4 are a plurality of second electrode fingers connected to a second bus bar 6. The plurality of electrodes 3 and the plurality of electrodes 4 are interdigitated with each other.

The electrode 3 and the electrode 4 have a rectangular or substantially rectangular shape and a length direction. In a direction orthogonal or substantially orthogonal to the length direction, the electrode 3 and the adjacent electrode 4 oppose each other. The plurality of electrodes 3 and 4, the first bus bar 5, and the second bus bar 6 define an interdigital transducer (IDT) electrode. The length direction of the electrodes 3 and 4 and the direction orthogonal or substantially orthogonal to the length direction of the electrodes 3 and 4 are both directions intersecting the thickness direction of the piezoelectric layer 2. Therefore, it can also be said that the electrode 3 and the adjacent electrode 4 oppose each other in a direction intersecting the thickness direction of the piezoelectric layer 2.

The length direction of the electrodes 3 and 4 may be interchanged with the direction orthogonal or substantially orthogonal to the length direction of the electrodes 3 and 4 illustrated in FIGS. 1A and 1B. That is, in FIGS. 1A and 1B, the electrodes 3 and 4 may extend in the direction in which the first bus bar 5 and the second bus bar 6 extend. In this case, the first bus bar 5 and the second bus bar 6 extend in the direction in which the electrodes 3 and 4 extend in FIGS. 1A and 1B.

A plurality of pairs of structures in which the electrode 3 connected to one potential and the electrode 4 connected to the other potential are adjacent to each other are provided in a direction orthogonal or substantially orthogonal to the length direction of the electrodes 3 and 4. Here, "the electrode 3 and the electrode 4 are adjacent to each other" refers not to a case where the electrode 3 and the electrode 4 are disposed so as to be in direct contact with each other, but a case where the electrode 3 and the electrode 4 are disposed with an interval therebetween.

When the electrode 3 and the electrode 4 are adjacent to each other, no electrode connected to the hot electrode or the ground electrode including the other electrodes 3 and 4 is disposed between the electrode 3 and the electrode 4. This number of pairs needs not be an integer pair, and may be, for example, 1.5 pairs, 2.5 pairs, or the like. The center-to-center distance between the electrodes 3 and 4, that is, the pitch is preferably in a range of, for example, about 1 μm or more and about 10 μm or less. The center-to-center distance between the electrodes 3 and 4 is a distance obtained by connecting the center of the width dimension of the electrode 3 in the direction orthogonal or substantially orthogonal to the length direction of the electrode 3 and the center of the width dimension of the electrode 4 in the direction orthogonal or substantially orthogonal to the length direction of the electrode 4. Furthermore, when there are a plurality of at least one of the electrodes 3 and 4 (when the electrodes 3 and 4 define a pair of electrode sets, there are 1.5 or more pairs of electrode sets), the center-to-center distance between the electrodes 3 and 4 refers to a mean value of the center-to-center distances of the adjacent electrodes 3 and 4 among 1.5 or more pairs of electrodes 3 and 4. The width of the electrodes 3 and 4, that is, the dimension of the electrodes 3 and 4 in the opposing direction is preferably in a range of, for example, about 150 nm or more and about 1000 nm or less. The center-to-center distance between the electrodes 3 and 4 is a distance obtained by connecting the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the present preferred embodiment, since the Z cut piezoelectric layer is used, the direction orthogonal or substantially orthogonal to the length direction of the electrodes 3 and 4 is a direction orthogonal or substantially orthogonal to the polarization direction of the piezoelectric layer 2. This is not the case when a piezoelectric body with another cut angle is used as the piezoelectric layer 2. Here, "orthogonal" is not limited to a case where the electrodes 3 and 4 are strictly orthogonal to each other, and may be substantially orthogonal (an angle formed by a direction orthogonal to the length direction of the electrodes 3 and 4 and the polarization direction is, for example, about 90°±10°).

On the second main surface 2b side of the piezoelectric layer 2, a support member 8 is stacked with an insulating layer 7 interposed therebetween. The insulating layer 7 and the support member 8 have a frame shape, and include openings 7a and 8a as illustrated in FIG. 2. As a result, a cavity 9 is provided. The cavity 9 is provided so as not to disturb the vibration of an excitation region C of the piezoelectric layer 2. Therefore, the support member 8 is stacked on the second main surface 2b with the insulating layer 7 interposed therebetween at a position not overlapping a portion where at least the pair of electrodes 3 and is provided. The insulating layer 7 may not be provided. Therefore, the support member 8 may be directly or indirectly stacked on the second main surface 2b of the piezoelectric layer 2.

The insulating layer 7 is made of, for example, silicon oxide. However, other than silicon oxide, an appropriate insulating material such as, for example, silicon oxynitride or alumina can be used. The support member 8 is made of, for example, Si. The plane orientation of Si on the surface on the piezoelectric layer 2 side may be (100), (110), or (111). High-resistance Si having a resistivity of, for example, about 4 kΩ or more is preferable. However, the support member 8 can also be configured using, for example, an appropriate insulating material or semiconductor material. As a material of the support member 8, for example, a piezoelectric body such as aluminum oxide, lithium tantalate, lithium niobate, or quartz, various ceramics such as alumina, magnesia, sapphire, silicon nitride, aluminum nitride, silicon carbide, zirconia, cordierite, mullite, steatite, or forsterite, a dielectric such as diamond or glass, or a semiconductor such as gallium nitride can be used.

The plurality of electrodes 3 and 4 and the first and second bus bars 5 and 6 are made of, for example, an appropriate metal or alloy such as Al or an AlCu alloy. In the present preferred embodiment, the electrodes 3 and 4 and the first and second bus bars 5 and 6 have a structure including an Al film stacked on a Ti film. An adhesion layer other than the Ti film may be used.

At the time of driving, an AC voltage is applied between the plurality of electrodes 3 and the plurality of electrodes 4. More specifically, an AC voltage is applied between the first bus bar 5 and the second bus bar 6. As a result, it is possible to obtain resonance characteristics using a bulk wave of a thickness slip primary mode excited in the piezoelectric layer 2.

In the acoustic wave device 1, when the thickness of the piezoelectric layer 2 is d and the center-to-center distance between adjacent electrodes 3 and 4 of any one of the plurality of pairs of electrodes 3 and 4 is p, d/p is, for example, about 0.5 or less. Therefore, the bulk wave of the thickness slip primary mode is effectively excited, and good resonance characteristics can be obtained. More preferably, d/p is, for example, about 0.24 or less, and in that case, even better resonance characteristics can be obtained.

When there are a plurality of at least one of the electrodes 3 and 4 as in the present preferred embodiment, that is, when the electrodes 3 and 4 define a pair of electrodes and there are 1.5 or more pairs of electrodes 3 and 4, the center-to-center distance p between the adjacent electrodes 3 and 4 is a mean distance of the center-to-center distances between the adjacent electrodes 3 and 4.

Since the acoustic wave device 1 of the present preferred embodiment has the above configuration, even if the number of pairs of the electrodes 3 and 4 are reduced in order to achieve miniaturization, the Q factor is less likely to decrease. This is because a resonator does not require reflectors on both sides and propagation loss is small. The reason why the reflector is not required is that the bulk wave of the thickness slip primary mode is used.

A difference between the Lamb wave used in the conventional acoustic wave device and the bulk wave of the thickness slip primary mode will be described with reference to FIGS. 3A and 3B.

Figure 3A:
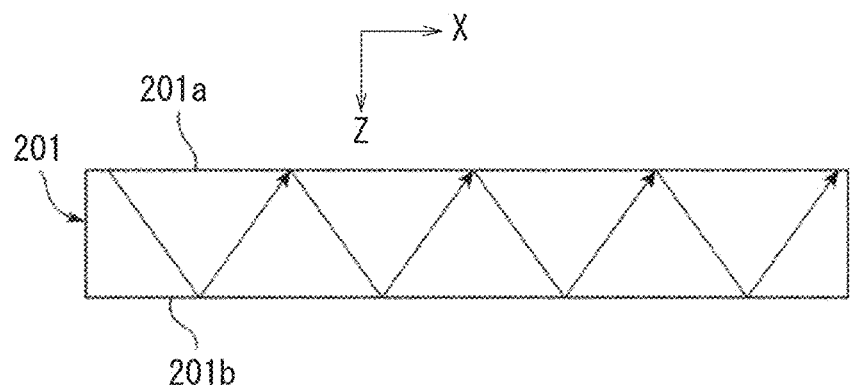
FIG. 3A is a schematic front cross-sectional view for explaining a Lamb wave propagating through a piezoelectric film of a conventional acoustic wave device.

FIG. 3A is a schematic front cross-sectional view for explaining a Lamb wave propagating through a piezoelectric film of a conventional acoustic wave device. A conventional acoustic wave device is described in, for example, Japanese Patent Application Laid-Open No. 2012-257019. As illustrated in FIG. 3A, in the conventional acoustic wave device, waves propagate in a piezoelectric film 201 as indicated by arrows. Here, in the piezoelectric film 201, a first main surface 201a and a second main surface 201b oppose each other, and the thickness direction connecting the first main surface 201a and the second main surface 201b is the Z direction. The X direction is a direction in which electrode fingers of the IDT electrode are provided. As illustrated in FIG. 3A, in the Lamb wave, the wave propagates in the X direction as illustrated. Since it is a plate wave, the piezoelectric film 201 vibrates as a whole, but since the wave propagates in the X direction, reflectors are provided on both sides to obtain resonance characteristics. Therefore, a wave propagation loss occurs, and the Q factor decreases when miniaturization is attempted, that is, when the number of pairs of electrode fingers is reduced.

Figure 3B:
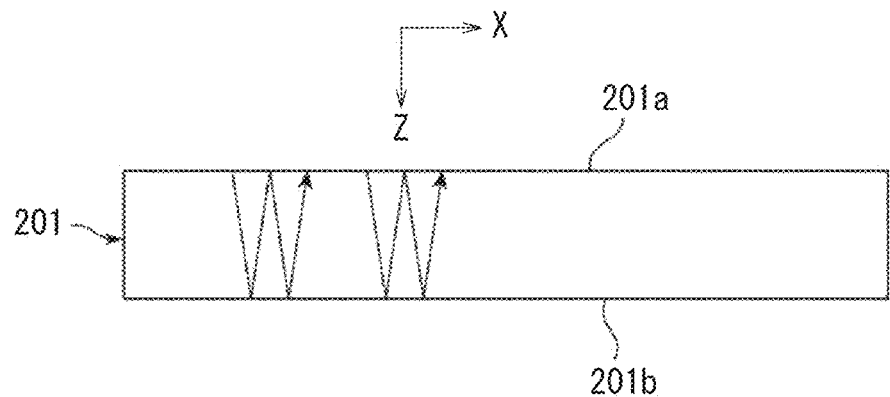
FIG. 3B is a schematic front cross-sectional view for explaining a wave of an acoustic wave device according to a preferred embodiment of the present invention.

On the other hand, as illustrated in FIG. 3B, in the acoustic wave device 1 of the present preferred embodiment, since the vibration displacement is in the thickness slip direction, the wave substantially propagates in the direction connecting the first main surface 2a and the second main surface 2b of the piezoelectric layer 2, that is, in the Z direction, and resonates. That is, the X direction component of the wave is significantly smaller than the Z direction component. Since resonance characteristics are obtained by the propagation of the wave in the Z direction, a reflector is not required. Therefore, no propagation loss occurs at the time of propagation to the reflector. Therefore, even if the number of pairs of the electrode pair including the electrodes 3 and 4 is reduced in order to improve miniaturization, the Q factor is less likely to decrease.

Figure 4:
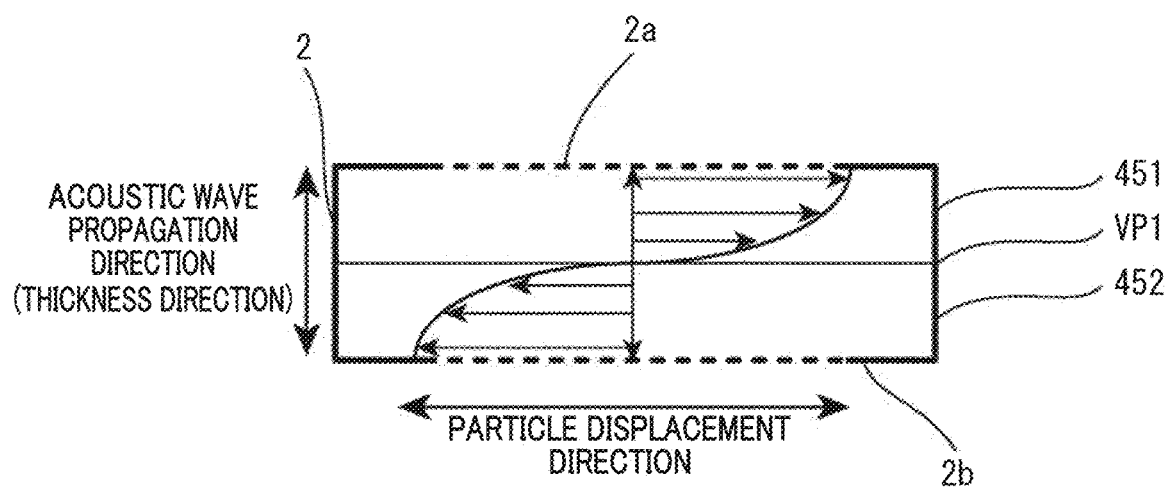
FIG. 4 is a schematic diagram illustrating a bulk wave when a voltage at which a second electrode has a higher potential than that of a first electrode is applied between the first electrode and the second electrode.

As illustrated in FIG. 4, the amplitude direction of the bulk wave in the thickness slip primary mode is reversed between a first region 451 included in the excitation region C of the piezoelectric layer 2 and a second region 452 included in the excitation region C. FIG. 4 schematically illustrates a bulk wave when a voltage at which the electrode 4 has a higher potential than the electrode 3 is applied between the electrode 3 and the electrode 4. The first region 451 is a region between the first main surface 2a and a virtual plane VP1 orthogonal or substantially orthogonal to the thickness direction of the piezoelectric layer 2 and dividing the piezoelectric layer 2 in the excitation region C. The second region 452 is between the virtual plane VP1 and the second main surface 2b in the excitation region C.

As described above, in the acoustic wave device 1, at least one pair of electrodes including the electrode 3 and the electrode 4 is provided, but since a wave is not propagated in the X direction, the number of pairs of electrodes including the electrodes 3 and 4 does not necessarily have to be plural. That is, at least one pair of electrodes only needs to be provided.

For example, the electrode 3 is an electrode connected to a hot potential, and the electrode 4 is an electrode connected to a ground potential. However, the electrode 3 may be connected to the ground potential, and the electrode 4 may be connected to the hot potential. In the present preferred embodiment, at least one pair of electrodes is an electrode connected to a hot potential or an electrode connected to a ground potential as described above, and is not provided with a floating electrode.

Figure 5:
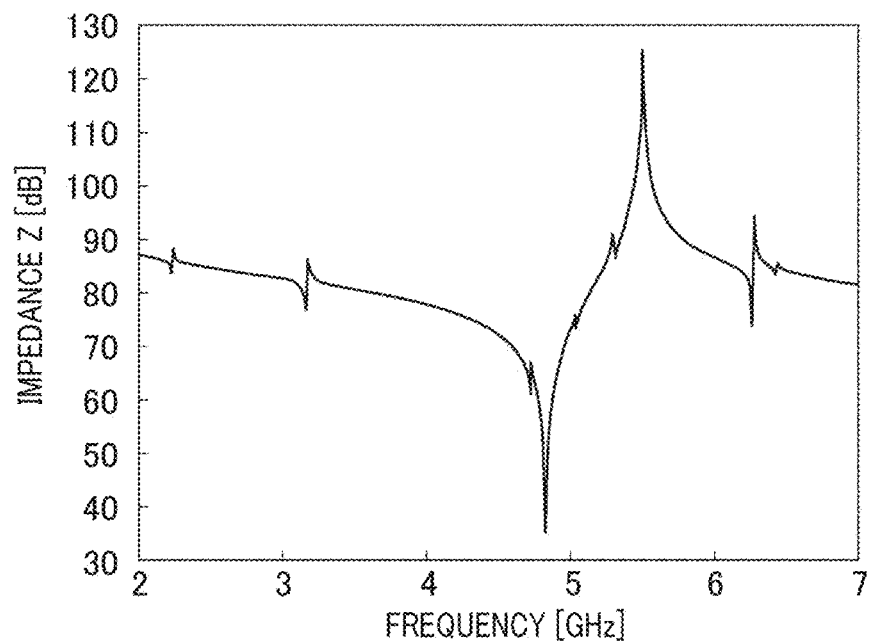
FIG. 5 is a diagram illustrating resonance characteristics of an acoustic wave device according to a first preferred embodiment of the present invention.

FIG. 5 is a diagram illustrating resonance characteristics of an acoustic wave device according to the first preferred embodiment of the present invention. Design parameters of the acoustic wave device 1 that has obtained the resonance characteristics are as follows:

Piezoelectric layer 2: $LiNbO_3$ with Euler angle (0°, 0°, 90°), thickness=about 400 nm. When viewed in the direction orthogonal or substantially orthogonal to the length direction of the electrode 3 and the electrode 4, the region where the electrode and the electrode 4 overlap, that is, the length of the excitation region C=about 40 μm, the number of pairs of the electrodes 3 and 4=21 pairs, the inter-electrode center distance=about 3 μm, the widths of the electrodes 3 and 4=about 500 nm, and d/p=about 0.133;

Insulating layer 7: a silicon oxide film having a thickness of about 1 μm; and

Support member 8: Si.

The length of the excitation region C is a dimension along the length direction of the electrodes 3 and 4 of the excitation region C.

In the present preferred embodiment, the inter-electrode distances of the electrode pairs including the electrodes 3 and 4 are all equal or substantially equal in a plurality of pairs. That is, the electrodes 3 and 4 are provided at an equal or substantially equal pitch.

As is clear from FIG. 5, good resonance characteristics with a fractional bandwidth of about 12.5% are obtained in spite of not including any reflectors.

When the thickness of the piezoelectric layer 2 is d and the center-to-center distance between the electrodes 3 and 4 is p, as described above, d/p is, for example, about 0.5 or less, and more preferably, for example, about 0.24 or less in the present preferred embodiment. This will be described with reference to FIG. 6.

Figure 6:
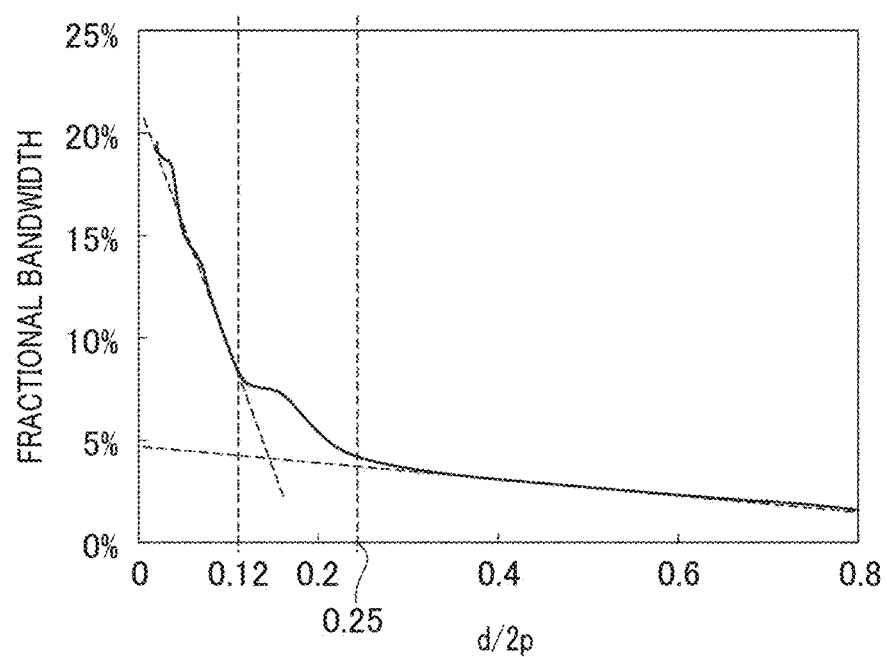
FIG. 6 is a diagram illustrating a relationship between d/2p and a fractional bandwidth as a resonator of the acoustic wave device according to the first preferred embodiment of the present invention.

Similarly to the acoustic wave device that obtained the resonance characteristics illustrated in FIG. 5, a plurality of acoustic wave devices were obtained by changing d/2p. FIG. 6 is a diagram illustrating a relationship between d/2p and a fractional bandwidth as a resonator of the acoustic wave device.

As is clear from FIG. 6, when d/2p exceeds about 0.25, that is, when d/p>about 0.5, even if d/p is adjusted, the fractional bandwidth is less than about 5%. On the other hand, in the case of d/2p≤about 0.25, that is, d/p≤about 0.5, if d/p is changed within the range, the fractional bandwidth can be set to about 5% or more, that is, a resonator having a high coupling coefficient can be obtained. When d/2p is about 0.12 or less, that is, when d/p is about 0.24 or less, the fractional bandwidth can be increased to about 7% or more. If d/p is adjusted within this range, a resonator having a wider fractional bandwidth can be obtained, and a resonator having a higher coupling coefficient can be achieved. Therefore, as in the acoustic wave device according to the present preferred embodiment, by setting d/p to about 0.5 or less, it was discovered that a resonator having a high coupling coefficient using the bulk wave of the thickness slip primary mode can be provided.

As described above, at least one pair of electrodes may be one pair, and in the case of one pair of electrodes, p is a center-to-center distance between adjacent electrodes 3 and 4. In the case of 1.5 or more pairs of electrodes, the mean distance of the center-to-center distance of the adjacent electrodes 3 and 4 only needs to be p.

As for the thickness d of the piezoelectric layer, when the piezoelectric layer 2 has a thickness variation, a value obtained by averaging the thicknesses may be used.

Figure 7:
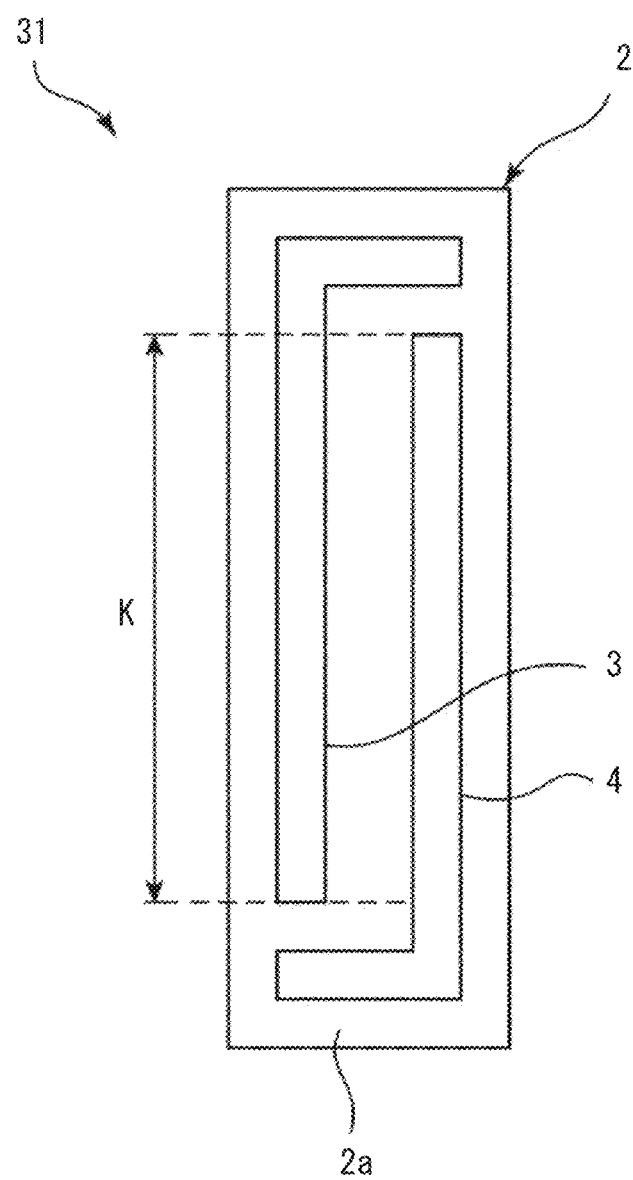
FIG. 7 is a plan view of another acoustic wave device according to the first preferred embodiment of the present invention.

FIG. 7 is a plan view of another acoustic wave device according to the first preferred embodiment of the present invention. In the acoustic wave device 31, a pair of electrodes including an electrode 3 and an electrode 4 are provided on the first main surface 2a of the piezoelectric layer 2. K in FIG. 7 is the crossing width. As described above, in the acoustic wave device 31 of the present preferred embodiment, the number of pairs of the electrodes may be one. Also in this case, when d/p is about 0.5 or less, the bulk wave in the thickness slip primary mode can be effectively excited.

In the acoustic wave device 1, preferably, in the plurality of electrodes 3 and 4, the metallization ratio MR of the adjacent electrodes 3 and 4 to the excitation region, which is a region overlapping when viewed in a direction in which any of the adjacent electrodes 3 and 4 opposes, satisfies MR≤about 1.75 (d/p)+0.075. That is, a region where the first electrode finger 3 and a second electrode finger 4 adjacent to each other overlap each other when viewed from a direction in which the first electrode finger 3 and the second electrode finger 4 are provided is a crossover region, and when a metallization ratio of the plurality of electrode fingers 3 and 4 to the crossover region is MR, MR≤about 1.75 (d/p)+0.075 is preferably satisfied. In that case, the spurious response can be effectively reduced.

Figure 8:
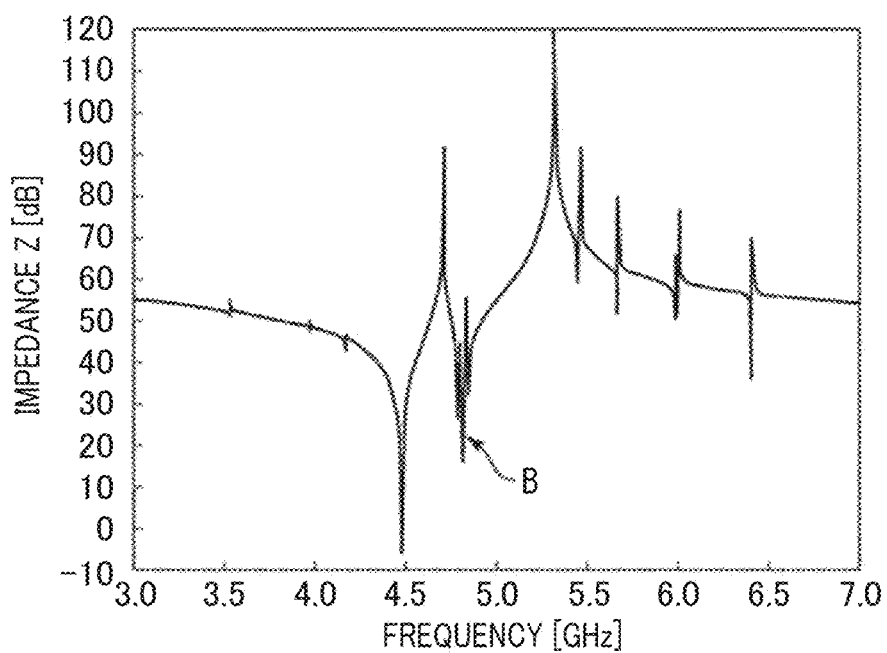
FIG. 8 is a reference diagram illustrating an example of resonance characteristics of the acoustic wave device according to the first preferred embodiment of the present invention.

This will be described with reference to FIGS. 8 and 9. FIG. 8 is a reference diagram illustrating an example of resonance characteristics of the acoustic wave device 1. The spurious response indicated by the arrow B appears between the resonance frequency and the anti-resonance frequency. Note that d/p=about 0.08 and the Euler angle of $LiNbO_3$ about (0°, 0°, 90°) were set. The metallization ratio MR was set to about 0.35.

The metallization ratio MR will be described with reference to FIG. 1B. In the electrode structure of FIG. 1B, when focusing on the pair of electrodes 3 and 4, it is assumed that only this pair of electrodes 3 and 4 is provided. In this case, a portion surrounded by an alternate long and short dash line C is an excitation region. The excitation region is a region in which the electrode 3 and the electrode 4 overlap each other when the electrode 3 and the electrode 4 are viewed in a direction orthogonal or substantially orthogonal to the length direction of the electrodes 3 and 4, that is, in an opposing direction, a region in which the electrode 3 and the electrode 4 overlap each other in the electrode 3, a region in which the electrode 4 overlap each other in the electrode 4, and a region between the electrode 3 and the electrode 4. Then, the area of the electrodes 3 and 4 in the excitation region C with respect to the area of the excitation region is the metallization ratio MR. That is, the metallization ratio MR is a ratio of the area of the metallization portion to the area of the excitation region.

In a case where a plurality of pairs of electrodes are provided, the ratio of the metallization portion included in the entire excitation region to the total area of the excitation region only needs to be set as MR.

Figure 9:
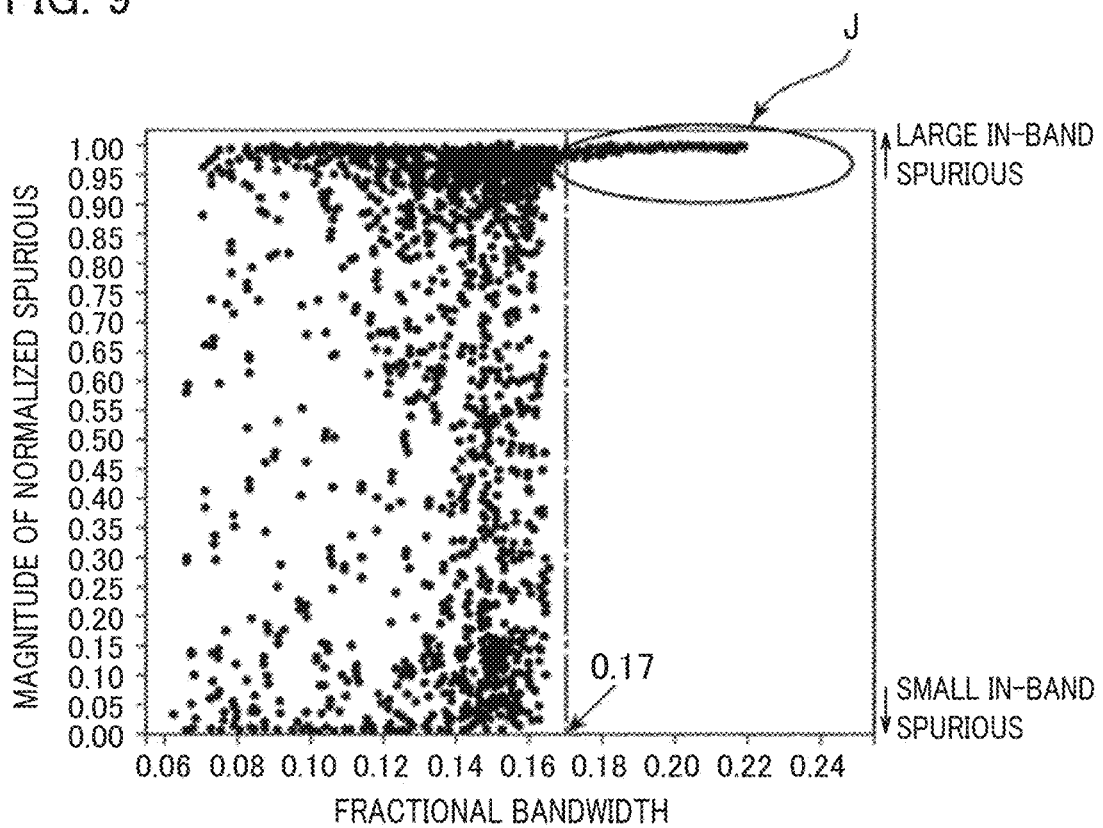
FIG. 9 is a diagram illustrating a relationship between a fractional bandwidth in a case where a large number of acoustic wave resonators are provided and a phase rotation amount of an impedance of a spurious normalized by about 180 degrees as a magnitude of the spurious response.

FIG. 9 is a diagram illustrating a relationship between a fractional bandwidth in a case where a large number of acoustic wave resonators are provided and a phase rotation amount of an impedance of a spurious normalized by about 180 degrees as a magnitude of the spurious response according to the present preferred embodiment. The fractional bandwidth was adjusted by variously changing the film thickness of the piezoelectric layer and the dimension of the electrode. FIG. 9 illustrates the result in the case of using the piezoelectric layer made of LiNbO$_3$ with Z cut, but the same or substantially the same tendency is obtained also in the case of using the piezoelectric layer with other cut angles.

In a region surrounded by an ellipse J in FIG. 9, the spurious response is as large as 1.0. As is clear from FIG. 9, when the fractional bandwidth exceeds about 0.17, that is, exceeds about 17%, a large spurious level of 1 or more appears within the passband even if the parameters constituting the fractional bandwidth are changed. That is, as in the resonance characteristic illustrated in FIG. 8, a large spurious response indicated by the arrow B appears in the band. Therefore, the fractional bandwidth is preferably about 17% or less. In this case, the spurious response can be reduced by adjusting the film thickness of the piezoelectric layer 2, the dimensions of the electrodes 3 and 4, and the like.

Figure 10:
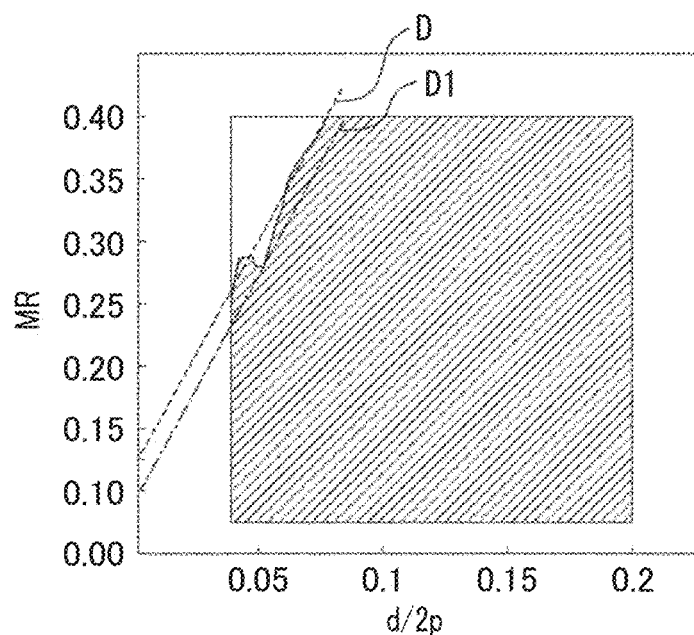
FIG. 10 is a diagram illustrating a relationship among d/2p, a metallization ratio MR, and a fractional bandwidth.

FIG. 10 is a diagram illustrating the relationship among d/2p, the metallization ratio MR, and the fractional bandwidth. In the above acoustic wave device, various acoustic wave devices having different d/2p and MR were provided, and a fractional bandwidth was measured. A hatched portion on the right side of the broken line D in FIG. 10 is a region having a fractional bandwidth of about 17% or less. The boundary between the hatched region and the non-hatched region is represented by MR=about 3.5 (d/2p)+0.075. That is, MR=about 1.75 (d/p)+0.075. Therefore, MR≤about 1.75 (d/p)+0.075 is preferable. In that case, the fractional bandwidth is easily set to about 17% or less. The region is more preferably a region on the right side of MR=about 3.5 (d/2p)+0.05 indicated by an alternate long and short dash line D1 in FIG. 10. That is, when MR≤about 1.75 (d/p)+0.05, the fractional bandwidth can be reliably set to about 17% or less.

Figure 11:
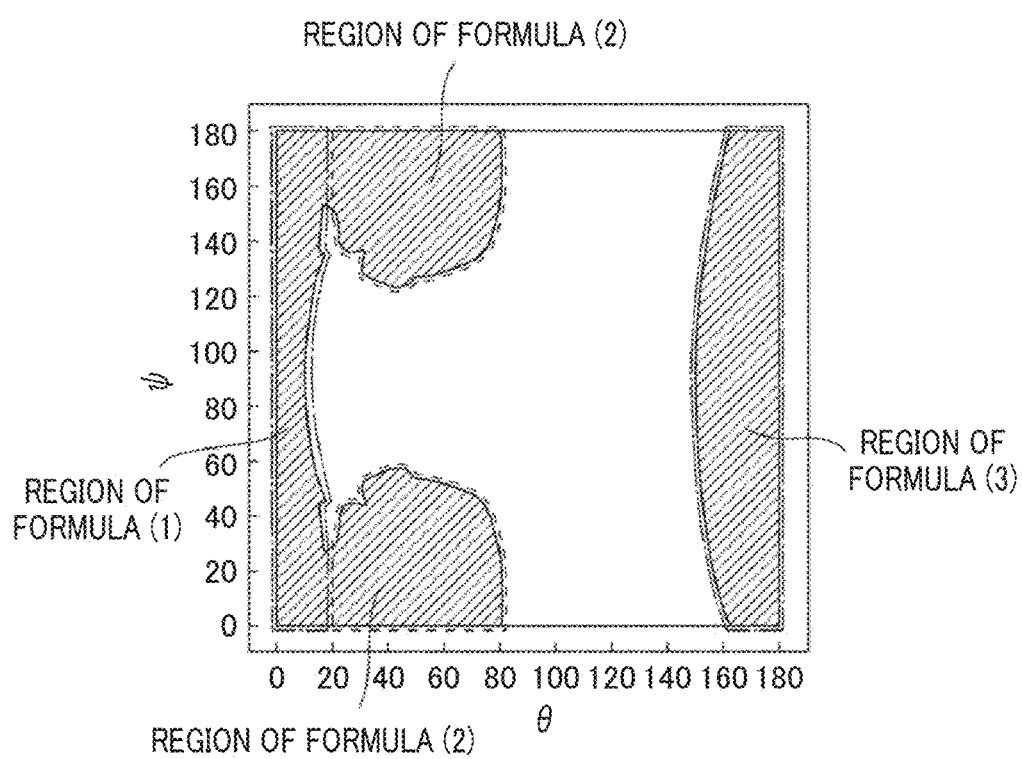
FIG. 11 is a diagram illustrating a map of a fractional bandwidth with respect to an Euler angle about (0°, θ, ψ) of LiNbO$_3$ when d/p is brought extremely close to 0.

FIG. 11 is a diagram illustrating a map of a fractional bandwidth with respect to an Euler angle (0°, θ, ψ) of LiNbO$_3$ when d/p is brought as close to 0. A hatched portion in FIG. 11 is a region in which a fractional bandwidth of at least about 5% or more is obtained, and when the range of the region is approximated, the range is expressed by the following Formulas (1), (2), and (3).

(0°±10°,0° to 20°,arbitrary ψ)  Formula (1)

(0°±10°,20° to 80°,0° to 60°(1−(θ−50)²/900)$^{1/2}$) or (0°±10°,20° to 80°,[180°−60°(1−(θ−50)²/900)$^{1/2}$] to 180°)  Formula (2)

(0°±10°,[180°−30°(1−(ψ−90)²/8100)$^{1/2}$] to 180°,arbitrary ψ)  Formula (3)

Therefore, in the case of the Euler angle range of the above Formula (1), Formula (2), or Formula (3), the fractional bandwidth can be sufficiently widened, which is preferable.

Figure 12:
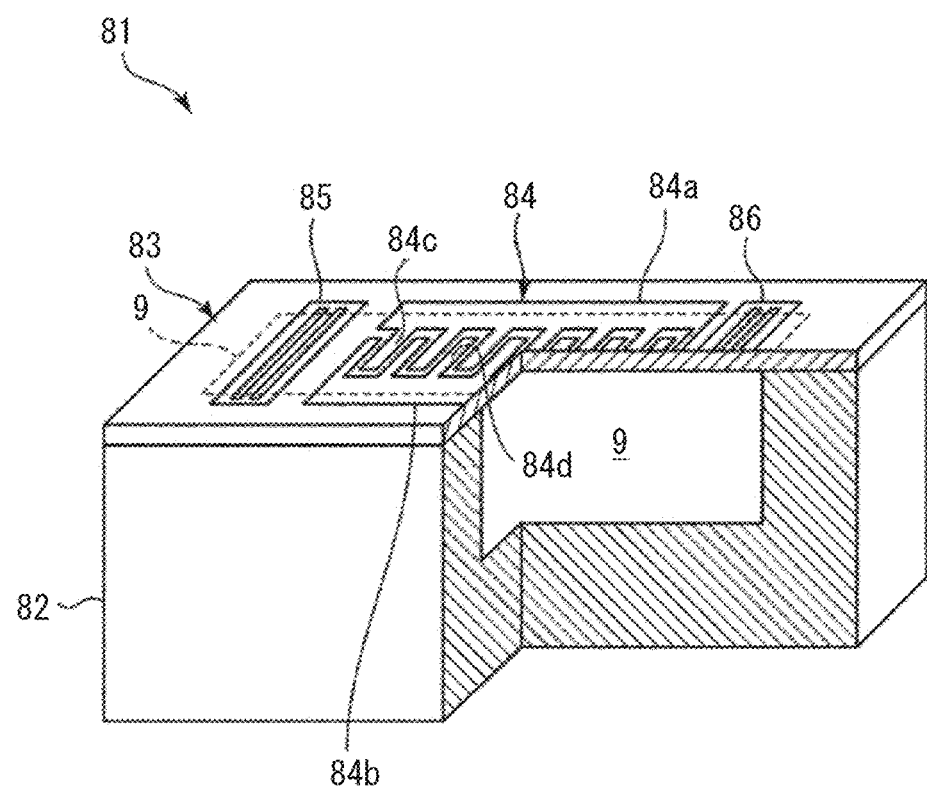
FIG. 12 is a partially cutaway perspective view for explaining the acoustic wave device according to the first preferred embodiment of the present invention.

FIG. 12 is a partially cutaway perspective view for explaining the acoustic wave device according to the first preferred embodiment of the present invention. An acoustic wave device 81 includes a support substrate 82. The support substrate 82 includes a recess opened on the upper surface. A piezoelectric layer 83 is stacked on the support substrate 82. Thus, the cavity is provided. An IDT electrode 84 is provided on the piezoelectric layer 83 above the cavity 9. Reflectors 85 and 86 are provided on both sides of the IDT electrode 84 in the acoustic wave propagation direction. In FIG. 12, the outer peripheral edge of the cavity 9 is indicated by a broken line. Here, the IDT electrode 84 includes first and second bus bars 84a and 84b, electrodes 84c as a plurality of first electrode fingers, and electrodes 84d as a plurality of second electrode fingers. The plurality of electrodes 84c are connected to the first bus bar 84a. The plurality of electrodes 84d are connected to the second bus bar 84b. The plurality of electrodes 84c and the plurality of electrodes 84d are interdigitated with each other.

In the acoustic wave device 81, a Lamb wave as a plate wave is excited by applying an AC electric field to the IDT electrode 84 above the cavity 9. Since the reflectors 85 and 86 are provided on both sides, resonance characteristics due to the Lamb wave can be obtained.

As described above, an acoustic wave device according to a preferred embodiment of the present invention may use a plate wave.

Second Preferred Embodiment

An acoustic wave device of a second preferred embodiment of the present invention will be described. In the second preferred embodiment, description of content overlapping with the first preferred embodiment will be omitted as appropriate. In the second preferred embodiment, the content described in the first preferred embodiment can be applied.

Figure 13:
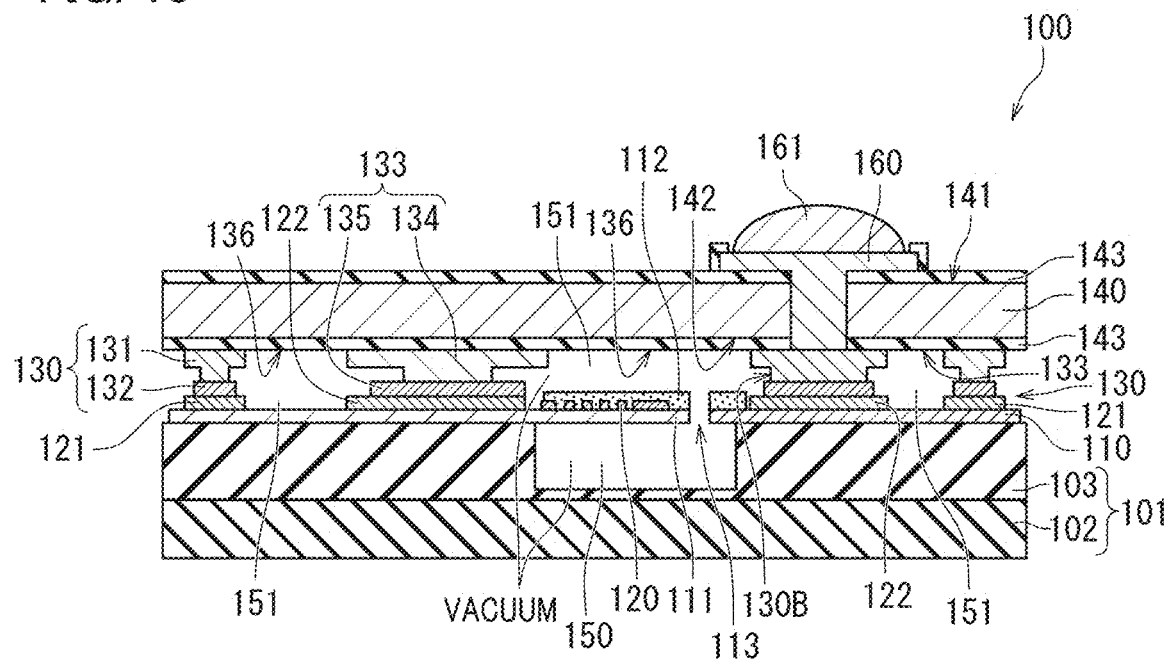
FIG. 13 is a schematic cross-sectional view of an acoustic wave device according to a second preferred embodiment of the present invention.

FIG. 13 is a schematic cross-sectional view of an acoustic wave device according to the second preferred embodiment of the present invention. As illustrated in FIG. 13, an acoustic wave device 100 includes a support member 101, a piezoelectric layer 110, a functional electrode 120, a support frame 130, a support column 133, and a lid 140. In the acoustic wave device 100, the support column 133 is not necessarily required.

The support member 101 includes a support substrate 102 and an intermediate layer 103. For example, the support substrate 102 includes a stack of the support substrate 102 made of Si and the intermediate layer 103 stacked on the support substrate 102 and made of, for example, SiOx. Note that the support member 101 only needs to include the support substrate 102, and may not include the intermediate layer 103. In the present description, the intermediate layer 103 may be referred to as a bonding layer 103.

The support member 101 includes a first cavity 150. The first cavity 150 is provided between the support member 101 and the piezoelectric layer 110. That is, the first cavity 150 is a space defined by the support member 101 and the piezoelectric layer 110. In the present preferred embodiment, the first cavity 150 is provided on the intermediate layer 103. Specifically, a recess is provided on a surface of the intermediate layer 103 opposite to a surface in contact with the support substrate 102. The recess is covered with the piezoelectric layer 110 to define the first cavity 150.

The first cavity 150 only needs to be provided in a portion of the support member 101, and may be provided in the support substrate 102 and the intermediate layer 103. Alternatively, in a case where the support member 101 does not include the intermediate layer 103, the first cavity 150 may be provided on the support substrate 102.

The piezoelectric layer 110 is provided on the support member 101. In the present preferred embodiment, the piezoelectric layer 110 is provided on the intermediate layer 103. Specifically, the piezoelectric layer 110 is provided on a surface of the intermediate layer 103 opposite to a surface in contact with the support substrate 102. The piezoelectric layer 110 covers an opening of the first cavity 150 provided on the intermediate layer 103.

In the present description, a portion of the piezoelectric layer 110 positioned in a region overlapping the first cavity 150 in plan view is referred to as a membrane 111. Note that "plan view" means viewing from the thickness direction of the acoustic wave device 100, that is, viewing from the stacking direction of the support member 101 and the piezoelectric layer 110.

The first cavity 150 may be provided in the support member 101 at a position overlapping at least a portion of the functional electrode 120 in plan view.

The piezoelectric layer 110 is made of, for example, LiNbOx or LiTaOx. In other words, the piezoelectric layer 110 includes, for example, lithium niobate or lithium tantalate. The thickness of the piezoelectric layer 110 is smaller than the thickness of the intermediate layer 103.

The functional electrode 120, the support frame 130, and the support column 133 are provided on the piezoelectric layer 110. In the present description, the support frame 130 and the support column 133 may be referred to as support bodies 130 and 133.

The functional electrode 120 includes a first bus bar and a second bus bar opposing each other, a plurality of first electrode fingers connected to the first bus bar, and a plurality of second electrode fingers connected to the second bus bar. The plurality of first electrode fingers and the plurality of second electrode fingers are interdigitated with each other, and a first electrode finger and a second electrode finger adjacent to each other define a pair of electrode set.

The functional electrode 120 is an IDT electrode including a plurality of first electrode fingers, a plurality of second electrode fingers, a first bus bar, and a second bus bar. In the present description, the functional electrode 120 may be referred to as an electrode unit 120.

The functional electrode 120 is provided on the piezoelectric layer 110 at a position overlapping the first cavity 150 in plan view. That is, the functional electrode 120 is provided on the membrane 111. The functional electrode 120 only needs to be provided on at least a portion of the membrane 111 in plan view.

On the piezoelectric layer 110, a dielectric film 112 covers the functional electrode 120. The dielectric film 112 may not be provided.

A plurality of wiring electrodes 121 and 122 electrically connected to the functional electrode 120 are provided on the piezoelectric layer 110. The plurality of wiring electrodes 121 and 122 include a first wiring electrode 121 and a second wiring electrode 122.

The first wiring electrode 121 and the second wiring electrode 122 are conductive films provided on the piezoelectric layer 110. The first wiring electrode 121 is provided on the piezoelectric layer 110 at a position overlapping the support frame 130 in plan view in the stacking direction of the support member 101 and the piezoelectric layer 110. The first wiring electrode 121 is connected to the support frame 130. The first wiring electrode 121 is electrically connected to the functional electrode 120. The first wiring electrode 121 does not overlap the first cavity 150 in plan view in the stacking direction of the support member 101 and the piezoelectric layer 110.

The second wiring electrode 122 is provided on the piezoelectric layer 110 at a position overlapping the support column 133 in plan view in the stacking direction of the support member 101 and the piezoelectric layer 110. The second wiring electrode 122 is connected to the support column 133. The second wiring electrode 122 is electrically connected to the functional electrode 120. The second wiring electrode 122 does not overlap the first cavity 150 in plan view in the stacking direction of the support member 101 and the piezoelectric layer 110.

The support frame 130 includes a frame-shaped seal electrode provided on the piezoelectric layer 110 and surrounding the functional electrode 120 in plan view in the stacking direction of the support member 101 and the piezoelectric layer 110. For example, the support frame 130 has a rectangular or substantially rectangular frame shape in plan view. The support frame 130 is provided on the piezoelectric layer 110 and supports the lid 140. The support frame 130 is disposed on the first wiring electrode 121, and is electrically connected to the first wiring electrode 121. The support frame 130 may include an insulator.

Specifically, the support frame 130 includes a first frame portion 131 and a second frame portion 132. The first frame portion 131 and the second frame portion 132 are connected in the stacking direction of the support member 101 and the piezoelectric layer 110.

The first frame portion 131 is disposed on the lid 140 side and is connected to the lid 140. The first frame portion 131 is a frame-shaped member surrounding the functional electrode 120 in plan view in the stacking direction of the support member 101 and the piezoelectric layer 110. The first frame portion 131 is made of, for example, a conductive material. For example, the first frame portion 131 is made of Au or the like.

The second frame portion 132 is positioned closer to the piezoelectric layer 110 than the first frame portion 131, and is disposed on the first wiring electrode 121. The second frame portion 132 is a frame-shaped member surrounding the functional electrode 120 in plan view in the stacking direction of the support member 101 and the piezoelectric layer 110. The second frame portion 132 is electrically connected to the first wiring electrode 121. The second frame portion 132 is made of, for example, a conductive material. The second frame portion 132 is made of, for example, Al or the like.

The support column 133 is provided on the piezoelectric layer 110 and disposed on both sides of the functional electrode 120 in plan view. That is, the support column 133 sandwiches the functional electrode 120. For example, the support column 133 has a columnar shape. The support column 133 is disposed on the second wiring electrode 122, and is electrically connected to the second wiring electrode 122.

The support column 133 includes a first portion 134 and a second portion 135. The first portion 134 and the second portion 135 are connected in the stacking direction of the support member 101 and the piezoelectric layer 110.

The first portion 134 is disposed on the lid 140 side and is connected to the lid 140. The first portion 134 is a columnar member disposed on both sides of the functional electrode 120 in plan view in the stacking direction of the support member 101 and the piezoelectric layer 110. The second portion 135 is electrically connected to the second wiring electrode 122. The first portion 134 is made of, for example, a conductive material. For example, the first portion 134 is made of Au or the like.

The second portion 135 is positioned closer to the piezoelectric layer 110 than the first portion 134, and is disposed on the second wiring electrode 122. The second portion 135 is a columnar member disposed on both sides of the functional electrode 120 in plan view in the stacking direction of the support member 101 and the piezoelectric layer 110. The second portion 135 is made of, for example, a conductive material. The second portion 135 is made of, for example, Al or the like.

At least a portion of the support column 133 may include an insulating material. This makes heat less likely to be transferred to the support column 133.

The support frame 130 and the support column 133 support the lid 140.

The lid 140 covers an opening 136 of the support frame 130. The opening 136 of the support frame 130 is provided on the side of the support frame 130 opposite to the side disposed on the piezoelectric layer 110. The lid 140 is defined by, for example, a plate-shaped member.

The lid 140 is provided on the support frame 130 and the support column 133, and is supported by the support frame 130 and the support column 133. Specifically, the lid 140 includes a first main surface 141 on the outer surface side and a second main surface 142 on the inner surface side opposite to the first main surface 141. The support frame 130 and the support column 133 are in contact with second main surface 142 of the lid 140 to support the lid 140.

The lid 140 includes an under bump metal 160 and a bump 161 electrically connected to the second wiring electrode 122 via the support column 133. In the present description, the under bump metal may be referred to as UBM (Under Bump Metal), and the bump may be referred to as BGA (Ball Grid Array).

The under bump metal 160 penetrates the lid 140 in the thickness direction of the lid 140. Specifically, the under bump metal 160 is provided in a through hole penetrating from the first main surface 141 toward the second main surface 142 of the lid 140. The under bump metal 160 is electrically connected to the first portion 134 of the support column 133.

The under bump metal 160 may be provided on the support frame 130.

The bump 161 is provided in the under bump metal 160. Specifically, the bump 161 is provided in a portion of the under bump metal 160 exposed on the first main surface 141 side of the lid 140.

The lid 140 is made of, for example, Si. The first main surface 141 and the second main surface 142 of the lid 140 are covered with an insulating film 143. For example, the insulating film 143 is made of an insulating material such as SiOx. The insulating film 143 may cover at least one of the first main surface 141 and the second main surface 142 of the lid 140. The insulating film 143 may cover the second main surface 142 of the lid 140. Such a configuration makes it possible to reduce or prevent heat from being transferred from the lid 140 to the piezoelectric layer 110 via the support column 133 when heat from the outside is applied to the lid 140.

In the acoustic wave device 100, a second cavity 151 is provided between the piezoelectric layer 110 including the functional electrode 120 and the lid 140. The second cavity 151 is defined by the piezoelectric layer 110, the support frame 130, and the lid 140.

The second cavity 151 is a space in which no gas is provided. For example, the second cavity 151 is a vacuum space. The vacuum space is, for example, a space having a degree of vacuum of about $10^{-4}$ Pa or less. This makes the heat from the outside of the acoustic wave device 100 less likely to reach the membrane 111, that is, the portion of the piezoelectric layer 110 overlapping the first cavity 150 in plan view in the stacking direction of the support member 101 and the piezoelectric layer 110. This makes it possible to reduce or prevent characteristic deterioration of the acoustic wave device 100 due to heat from the outside.

The piezoelectric layer 110 includes a through hole 113 that communicates with the first cavity 150 and the second cavity 151. Specifically, the membrane 111 of the piezoelectric layer 110 includes the through hole 113 that communicates with the first cavity 150 and the second cavity 151. This makes the first cavity 150 and the second cavity 151 linked via the through hole 113. Therefore, the first cavity 150 is a vacuum space similarly to the second cavity 151.

As described above, the piezoelectric layer 110 includes the through hole 113 that penetrates the piezoelectric layer 110 and extends to the first cavity 150 and the second cavity 151. Due to this, the first cavity 150 communicates with the second cavity 151 through the through hole 113, and the first cavity 150 and the second cavity 151 can be vacuumized.

In the acoustic wave device 100 of the present preferred embodiment, the support member 101 includes the first cavity 150 at a position overlapping at least a portion of the functional electrode 120 in plan view in the stacking direction of the support member 101 and the piezoelectric layer 110. The second cavity 151 defined by the piezoelectric layer 110, the support frame 130, and the lid 140 is provided between the piezoelectric layer 110 and the lid 140. The piezoelectric layer 110 is provided with the through hole 113 that communicates with the first cavity 150 and the second cavity 151, and the first cavity 150 and the second cavity 151 are vacuumized.

Such a configuration makes it possible to reduce or prevent deterioration of characteristics due to heat from the outside. In the acoustic wave device 100, since the first cavity 150 and the second cavity 151 are under vacuum, even if heat is applied from the outside of the acoustic wave device 100, the heat is less likely to be transferred to the piezoelectric layer 110. Due to this, even when heat is received from the outside, the characteristics of the acoustic wave device 100 are less likely to deteriorate.

The functional electrode 120 is provided in a portion of the piezoelectric layer 110 that overlaps the first cavity 150 and the second cavity 151 in plan view, that is, the membrane 111. The functional electrode 120 is easily affected by heat, and its characteristics are easily deteriorated when receiving heat. In the acoustic wave device 100, since the first cavity 150 and the second cavity 151 that are under vacuum are provided in the membrane 111, heat from the outside is less likely to be transferred as compared with other portions. Therefore, the acoustic wave device 100 can reduce or prevent deterioration of characteristics due to heat from the outside.

The first cavity 150 and the second cavity 151 communicate with each other through the through hole 113 provided in the piezoelectric layer 110. This reduces or prevents an air pressure difference from being generated between the first cavity 150 and the second cavity 151. As a result, it is possible to reduce or prevent the piezoelectric layer 110 from being broken by the air pressure difference between the first cavity 150 and the second cavity 151.

The acoustic wave device 100 includes the support column 133 disposed around the functional electrode 120, and at least a portion of the support column 133 includes an insulating material. Such a configuration makes heat less likely to be transferred to the support column 133, and can reduce or prevent heat from the outside from being transferred to the piezoelectric layer 110. This makes it possible to reduce or prevent deterioration of characteristics of the acoustic wave device 100 due to heat from the outside while improving rigidity of the acoustic wave device 100.

The acoustic wave device 100 includes a conductive film (second wiring electrode) 122 provided on the piezoelectric layer 110 and connected to the support column 133. The conductive film 122 does not overlap the first cavity 150 in plan view in the stacking direction of the support member 101 and the piezoelectric layer 110. Such a configuration makes it possible to reduce or prevent heat from the outside from being transferred to the piezoelectric layer 110 in the portion provided with the first cavity 150, that is, the membrane 111. This makes it possible to further reduce or prevent deterioration of the characteristics of the acoustic wave device 100 due to heat from the outside.

The support frame 130 includes a frame-shaped seal electrode provided on the piezoelectric layer 110 and surrounding the functional electrode 120 in plan view in the stacking direction of the support member 101 and the piezoelectric layer 110. Such a configuration can improve sealing performance of the support frame 130. This makes the first cavity 150 and the second cavity 151 easily maintained under vacuum.

The support member 101 includes the intermediate layer 103 provided on the support substrate 102, and the first cavity 150 is provided on the intermediate layer 103. Such a configuration makes it possible to insulate the piezoelectric layer 110 and the support substrate 120, and improve the characteristics of the acoustic wave device 100. The thickness of the piezoelectric layer 110 is smaller than the thickness of the intermediate layer 103, which makes the piezoelectric layer 110 more likely to deform, and makes breakage due to an air pressure difference less likely to occur.

The insulating film 143 is provided on the side of the lid 140 provided with the second cavity 151. Such a configuration can make heat less likely to be transferred by the insulating film 143 when the heat from the outside is applied to the lid 140.

The piezoelectric layer 110 includes, for example, lithium niobate or lithium tantalate. Since these materials have anisotropy and relatively easily deform, breakage of the piezoelectric layer due to an air pressure difference can be reduced or prevented.

Other Preferred Embodiments

As described above, the above-described preferred embodiments have been described as examples of the technology disclosed in the present application. However, the technology in the present disclosure is not limited thereto, and can also be applied to preferred embodiments in which changes, replacements, additions, omissions, and the like are made as appropriate. Therefore, other preferred embodiments will be exemplified below.

Figure 14:
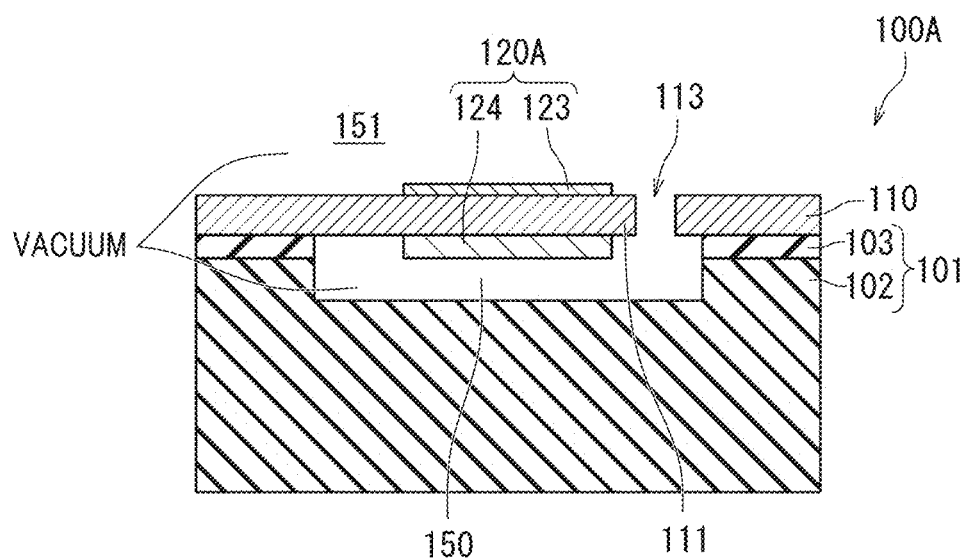
FIG. 14 is a schematic partial cross-sectional view of another acoustic wave device according to the second preferred embodiment of the present invention.

FIG. 14 is a schematic partial cross-sectional view of another acoustic wave device according to the second preferred embodiment of the present invention. As illustrated in FIG. 14, in an acoustic wave device 100A, a functional electrode 120A may be, for example, a bulk acoustic wave (BAW) element. The functional electrode 120A includes an upper electrode 123 and a lower electrode 124 opposing each other in the thickness direction of the piezoelectric layer 110 with the piezoelectric layer 110 interposed between the upper electrode 123 and the lower electrode 124.

The upper electrode 123 and the lower electrode 124 are provided in the membrane 111. The upper electrode 123 is disposed on the side where the second cavity 151 is provided in the piezoelectric layer 110. The lower electrode 124 is disposed on the side where the first cavity 150 is provided in the piezoelectric layer 110.

Also the acoustic wave device 100A can reduce or prevent deterioration of characteristics due to heat from the outside. It is also possible to reduce or prevent the piezoelectric layer 110 from being broken due to an air pressure difference.

An acoustic wave device according to a preferred embodiment of the present invention includes a support including a support substrate, a piezoelectric layer on the support, a functional electrode at the piezoelectric layer, a frame-shaped support frame on the piezoelectric layer and surrounding the functional electrode in a plan view in a stacking direction of the support and the piezoelectric layer, and a lid covering an opening of the support frame, wherein the support includes a first cavity at a position overlapping at least a portion of the functional electrode in the plan view in the stacking direction of the support and the piezoelectric layer, a second cavity defined by the piezoelectric layer, the support frame, and the lid between the piezoelectric layer and the lid, the piezoelectric layer includes a through hole communicating with the first cavity and the second cavity, and the first cavity and the second cavity are under vacuum.

An acoustic wave device according to a preferred embodiment of the present invention may further include a support column disposed around the functional electrode, and at least a portion of the support column may include an insulating material.

An acoustic wave device according to a preferred embodiment of the present invention may further include a support column disposed around the functional electrode, and a conductive film on the piezoelectric layer and connected to the support column, and the conductive film does not overlap the first cavity in the plan view in the stacking direction of the support and the piezoelectric layer.

In an acoustic wave device according to a preferred embodiment of the present invention, the support frame may include a frame-shaped seal electrode on the piezoelectric layer and surrounding the functional electrode in the plan view in the stacking direction of the support and the piezoelectric layer.

In an acoustic wave device according to a preferred embodiment of the present invention, the piezoelectric layer may include lithium niobate or lithium tantalate.

In the acoustic wave device according to a preferred embodiment of the present invention, the first cavity may be on the support substrate.

In an acoustic wave device according to a preferred embodiment of the present invention, the support may include an intermediate layer on the support substrate, and the first cavity may be on the intermediate layer.

In an acoustic wave device according to a preferred embodiment of the present invention, the thickness of the piezoelectric layer may be smaller than the thickness of the intermediate layer.

In an acoustic wave device according to a preferred embodiment of the present invention, an insulating film may be on a side of the lid where the second cavity is provided.

In an acoustic wave device according to a preferred embodiment of the present invention, the functional electrode may include a first bus bar and a second bus bar opposing each other, a first electrode finger connected to the first bus bar, and a second electrode finger connected to the second bus bar.

In an acoustic wave device according to a preferred embodiment of the present invention, d/p may be about 0.5 or less, where a film thickness of the piezoelectric layer is d, and a center-to-center distance between the first electrode finger and the second electrode finger adjacent to each other is p.

In an acoustic wave device according to a preferred embodiment of the present invention, d/p may be about 0.24 or less.

In an acoustic wave device according to a preferred embodiment of the present invention, a region where the first electrode finger and the second electrode finger adjacent to each other overlap each other when viewed from a direction in which the first electrode finger and the second electrode finger are provided is a crossover region, and when a metallization ratio of a plurality of electrode fingers to the crossover region is MR, MR≤about 1.75 (d/p)+0.075 may be satisfied.

In an acoustic wave device according to a preferred embodiment of the present invention, the functional electrode may include an upper electrode and a lower electrode opposing each other in a thickness direction of the piezoelectric layer with the piezoelectric layer interposed between the upper electrode and the lower electrode.

In an acoustic wave device according to a preferred embodiment of the present invention, an Euler angle ($\varphi$, $\theta$, $\psi$) of the lithium niobate or lithium tantalate may be in a range of following Formula (1), Formula (2), or Formula (3):

$$(0°\pm10°, 0° \text{ to } 20°, \text{arbitrary } \psi) \quad \text{Formula (1);}$$

$$(0°\pm10°, 20° \text{ to } 80°, 0° \text{ to } 60°(1-(\theta-50)^2/900)^{1/2}) \text{ or }$$
$$(0°\pm10°, 20° \text{ to } 80°, [180°-60°(1-(\theta-50)^2/900)^{1/2}] \text{ to } 180°) \quad \text{Formula (2); or}$$

$$(0°\pm10°, [180°-30°(1-(\psi-90)^2/8100)^{1/2}] \text{ to } 180°, \text{arbitrary } \psi) \quad \text{Formula (3).}$$

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate;
a piezoelectric layer on the support;
a functional electrode at the piezoelectric layer;
a support frame on the piezoelectric layer and surrounding the functional electrode in a plan view in a stacking direction of the support and the piezoelectric layer; and
a lid covering an opening of the support frame; wherein
the support includes a first cavity at a position overlapping at least a portion of the functional electrode in the plan view in the stacking direction of the support and the piezoelectric layer;
a second cavity defined by the piezoelectric layer, the support frame, and the lid is provided between the piezoelectric layer and the lid;
the piezoelectric layer includes a through hole communicating with the first cavity and the second cavity; and
the first cavity and the second cavity are under vacuum.

2. The acoustic wave device of claim 1 further comprising:
a support column disposed around the functional electrode; wherein
at least a portion of the support column includes an insulating material.

3. The acoustic wave device of claim 1 further comprising:
a support column disposed around the functional electrode; and
a conductive film on the piezoelectric layer and connected to the support column; wherein
the conductive film does not overlap the first cavity in the plan view in the stacking direction of the support and the piezoelectric layer.

4. The acoustic wave device of claim 1, wherein the support frame includes a seal electrode on the piezoelectric layer and surrounding the functional electrode in the plan view in the stacking direction of the support and the piezoelectric layer.

5. The acoustic wave device of claim 1, wherein the piezoelectric layer includes lithium niobate or lithium tantalate.

6. The acoustic wave device of claim 5, wherein an Euler angle ($\varphi$, $\theta$, $\psi$) of the lithium niobate or lithium tantalate is in a range of following Formula (1), Formula (2), or Formula (3):

$$(0°\pm10°, 0° \text{ to } 20°, \text{arbitrary } \psi) \quad \text{Formula (1);}$$

$$(0°\pm10°, 20° \text{ to } 80°, 0° \text{ to } 60°(1-(\theta-50)^2/900)^{1/2}) \text{ or }$$
$$(0°\pm10°, 20° \text{ to } 80°, [180°-60°(1-(\theta-50)^2/900)^{1/2}] \text{ to } 180°) \quad \text{Formula (2); or}$$

$$(0°\pm10°, [180°-30°(1-(\psi-90)^2/8100)^{1/2}] \text{ to } 180°, \text{arbitrary } \psi) \quad \text{Formula (3).}$$

7. The acoustic wave device of claim 1, wherein the first cavity is on the support substrate.

8. The acoustic wave device of claim 1, wherein
the support includes an intermediate layer on the support substrate; and
the first cavity is on the intermediate layer.

9. The acoustic wave device of claim 8, wherein a thickness of the piezoelectric layer is smaller than a thickness of the intermediate layer.

10. The acoustic wave device of claim 1, wherein an insulating film is on a side of the lid at which the second cavity is provided.

11. The acoustic wave device of claim 1, wherein the functional electrode includes a first bus bar and a second bus bar opposing each other, a first electrode finger connected to the first bus bar, and a second electrode finger connected to the second bus bar.

12. The acoustic wave device of claim 11, wherein d/p is about 0.5 or less, where a film thickness of the piezoelectric layer is d, and a center-to-center distance between the first electrode finger and the second electrode finger adjacent to each other is p.

13. The acoustic wave device of claim 12, wherein d/p is about 0.24 or less.

14. The acoustic wave device of claim 11, wherein
a region where the first electrode finger and the second electrode finger adjacent to each other overlap each other when viewed from a direction in which the first electrode finger and the second electrode finger are provided is a crossover region; and when a metallization ratio of a plurality of electrode fingers to the crossover region is MR, and MR≤1.75 (d/p)+0.075.

15. The acoustic wave device of claim 1, wherein the functional electrode includes an upper electrode and a lower electrode opposing each other in a thickness direction of the piezoelectric layer with the piezoelectric layer interposed between the upper electrode and the lower electrode.

16. The acoustic wave device of claim 1, wherein a thickness of the piezoelectric layer is about 50 nm or more and about 1000 nm or less.

17. The acoustic wave device of claim 1, wherein the frame-shaped support frame includes an insulating layer.

18. The acoustic wave device of claim 17, wherein the insulating layer is made of silicon oxide.

19. The acoustic wave device of claim 1, wherein the support is made of silicon.

20. The acoustic wave device of claim 19, wherein the silicon has a resistivity of 4 kΩ.

* * * * *